(12) United States Patent
Ke et al.

(10) Patent No.: US 12,402,270 B2
(45) Date of Patent: Aug. 26, 2025

(54) THERMAL MODULE

(71) Applicant: Acer Incorporated, New Taipei (TW)

(72) Inventors: Jau-Han Ke, New Taipei (TW);
Tsung-Ting Chen, New Taipei (TW);
Chun-Chieh Wang, New Taipei (TW);
Yu-Ming Lin, New Taipei (TW);
Cheng-Wen Hsieh, New Taipei (TW);
Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 209 days.

(21) Appl. No.: 18/167,063

(22) Filed: Feb. 9, 2023

(65) Prior Publication Data

US 2023/0262924 A1 Aug. 17, 2023

(30) Foreign Application Priority Data

Feb. 16, 2022 (TW) .................................. 111105522

(51) Int. Cl.
*H05K 7/20* (2006.01)

(52) U.S. Cl.
CPC ..... *H05K 7/20154* (2013.01); *H05K 7/20172* (2013.01); *H05K 7/20336* (2013.01); *H05K 7/20445* (2013.01)

(58) Field of Classification Search
CPC .. H05K 7/20; H05K 7/20136; H05K 7/20145; H05K 7/20154; H05K 7/20163; H05K 7/20172; H05K 7/20336; H05K 7/20409; H05K 7/20445; H01L 23/3677; H01L 23/427; H01L 23/467; G06F 1/185; G06F 1/20; G06F 1/203; F04D 29/281; F04D 29/282; F04D 29/4226; F04D 29/584; F04D 17/16; F28F 1/10; F28F 1/325
See application file for complete search history.

(56) References Cited

U.S. PATENT DOCUMENTS

| | | | |
|---|---|---|---|
| 9,029,696 B2 * | 5/2015 | Wang | H01L 23/427 174/50 |
| 2009/0034195 A1* | 2/2009 | Wang | H01L 23/427 361/700 |
| 2009/0034196 A1* | 2/2009 | Wang | H01L 23/467 361/702 |
| 2011/0048680 A1* | 3/2011 | Chen | F28D 15/0266 165/104.26 |

(Continued)

FOREIGN PATENT DOCUMENTS

| | | |
|---|---|---|
| CN | 101674715 | 6/2013 |
| TW | I456773 | 10/2014 |

(Continued)

*Primary Examiner* — Amir A Jalali
(74) *Attorney, Agent, or Firm* — JCIPRNET

(57) ABSTRACT

A thermal module includes a fan and a fin assembly. The fan has an air outlet. The fin assembly has multiple fins, and is disposed to the air outlet of the fan. The fins are disposed side by side to form multiple flow channels. Each of the flow channels has a first inlet, at least one second inlet, and an outlet. In each of the flow channels, a gas flow generated by the fan flows into the flow channel from the first inlet and flows out of the flow channel from the outlet, and a gas flow outside the fin assembly is drawn by the gas flow in the flow channel to flow into the flow channel from the at least one second inlet.

9 Claims, 5 Drawing Sheets

(56) References Cited

U.S. PATENT DOCUMENTS

| | | | | |
|---|---|---|---|---|
| 2012/0069521 A1* | 3/2012 | Hwang | ................ | H01L 23/427 |
| | | | | 165/104.26 |
| 2013/0286588 A1* | 10/2013 | Wang | ................... | H01L 23/467 |
| | | | | 361/697 |
| 2014/0085819 A1* | 3/2014 | Wang | ................ | H05K 7/20136 |
| | | | | 361/692 |
| 2017/0152864 A1* | 6/2017 | Lin | ....................... | F04D 29/582 |
| 2020/0159296 A1* | 5/2020 | Zhu | ................... | H05K 7/20145 |

FOREIGN PATENT DOCUMENTS

| | | |
|---|---|---|
| TW | I602998 | 10/2017 |
| TW | I663507 | 6/2019 |

\* cited by examiner

THERMAL MODULE

CROSS-REFERENCE TO RELATED APPLICATION

This application claims the priority benefit of Taiwan application serial no. 111105522, filed on Feb. 16, 2022. The entirety of the above-mentioned patent application is hereby incorporated by reference herein and made a part of this specification.

BACKGROUND

Technical Field

The disclosure relates to a thermal module.

Description of Related Art

Common electronic devices such as notebook computers, tablet computers, or smart phones have the characteristics of being easy to carry and sending, receiving, and processing information in real time, and have become an indispensable tool for modern people. Taking the notebook computers as an example, in order to satisfy the requirements of users, the thin lightweight design and the improvement of thermal performance have become the mainstream of development. Therefore, the space available for disposing a thermal module inside a body of the notebook computer is gradually reduced.

For example, the thermal module is usually disposed inside the body of the notebook computer, so that a fan of the thermal module and a fin assembly corresponding to the fan may perform active thermal dissipation. In addition, the common fin assembly is formed by multiple fins engaged with one another to form multiple flow channels, so that a gas flow generated by the fan may flow into the fin assembly and perform thermal exchange. However, in the current structural design of the fin assembly, cold air outside the thermal module may not flow into the fin assembly. As a result, the thermal dissipation efficiency of the thermal module may not be effectively improved.

SUMMARY

The disclosure provides a thermal module having good thermal dissipation efficiency.

The thermal module in the disclosure includes a fan and a fin assembly. The fan has an air outlet. The fin assembly has multiple fins, and is disposed to the air outlet of the fan. The fins are disposed side by side to form multiple flow channels. Each of the flow channels has a first inlet, at least one second inlet, and an outlet. In each of the flow channels, a gas flow generated by the fan flows into the flow channel from the first inlet and flows out of the flow channel from the outlet, and a gas flow outside the fin assembly is drawn by the gas flow in the flow channel to flow into the flow channel from the at least one second inlet.

Based on the above, the fin assembly of the thermal module in the disclosure has the fins, and the fins are disposed side by side to form the flow channels. In each of the flow channels, the gas flow generated by the fan is adapted to flow into the flow channel from the first inlet, and the gas flow outside the fin assembly is adapted to be drawn by gas flow in the flow channel to flow into the flow channel from the at least one second inlet. Therefore, in the thermal module in the disclosure, the fin assembly may increase the flow capacity of the gas flow flowing into the fin assembly through the configuration of the at least one second inlet. As a result, the proportion of the gas flow with the relatively low temperature flowing through each of the flow channels is increased, so as to improve the thermal exchange efficiency between the gas flow in each of the flow channels and the fin assembly, so that the thermal module in the disclosure has the good thermal dissipation efficiency.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
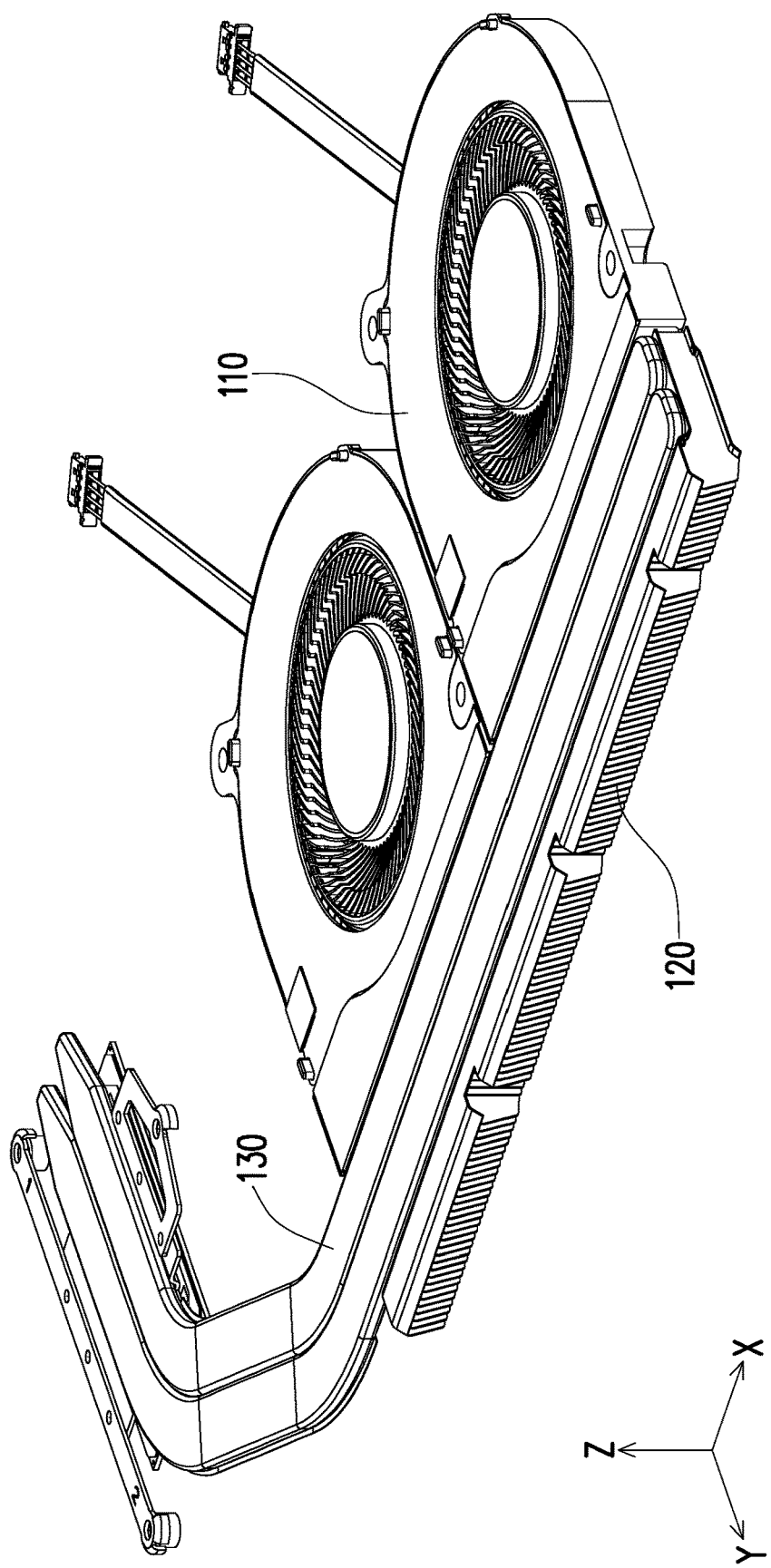
FIG. 1 is a perspective view of a thermal module according to an embodiment of the disclosure.
Figure 2:
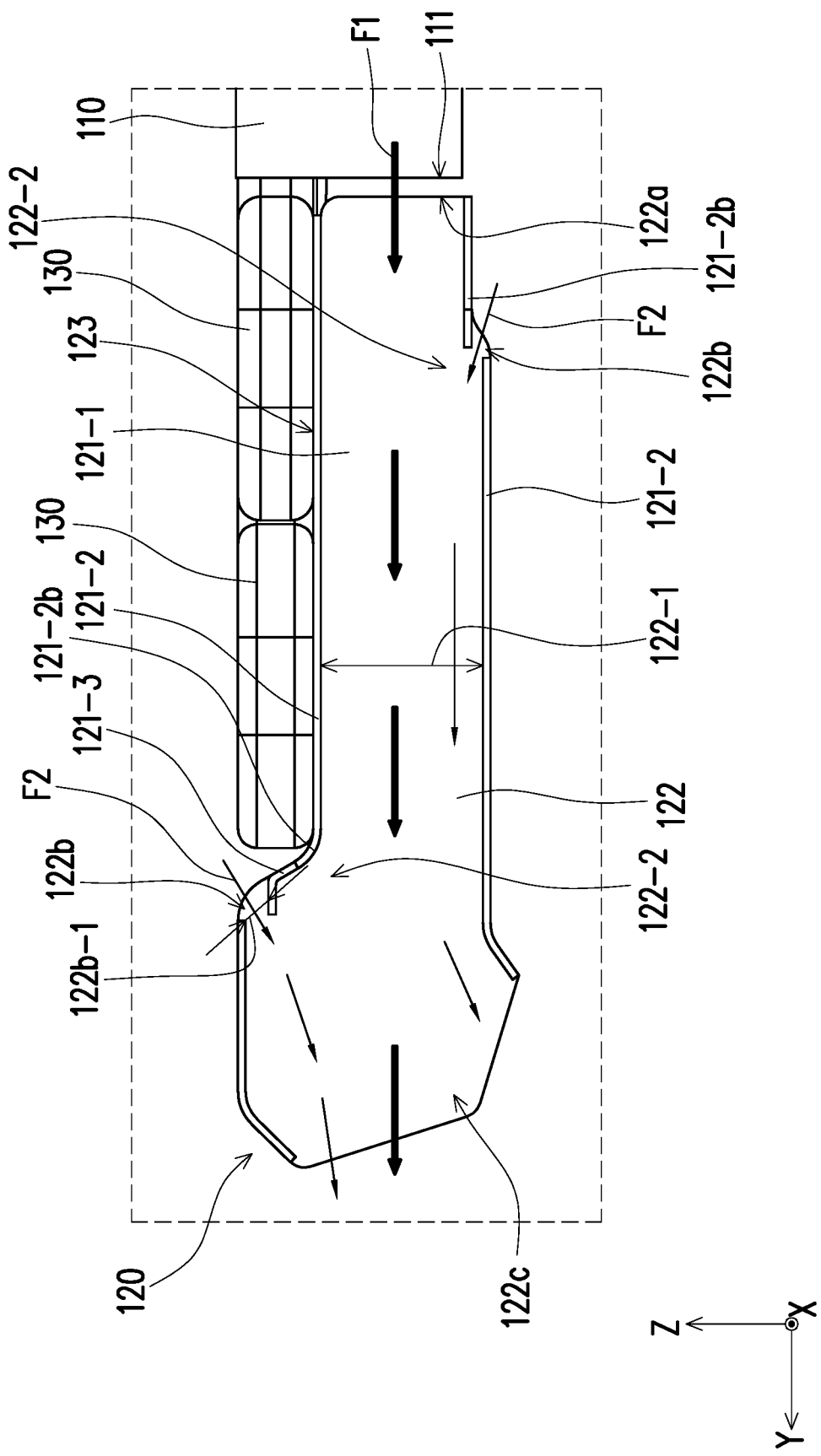
FIG. 2 is a partial side view of the thermal module of FIG. 1.
Figure 3A:
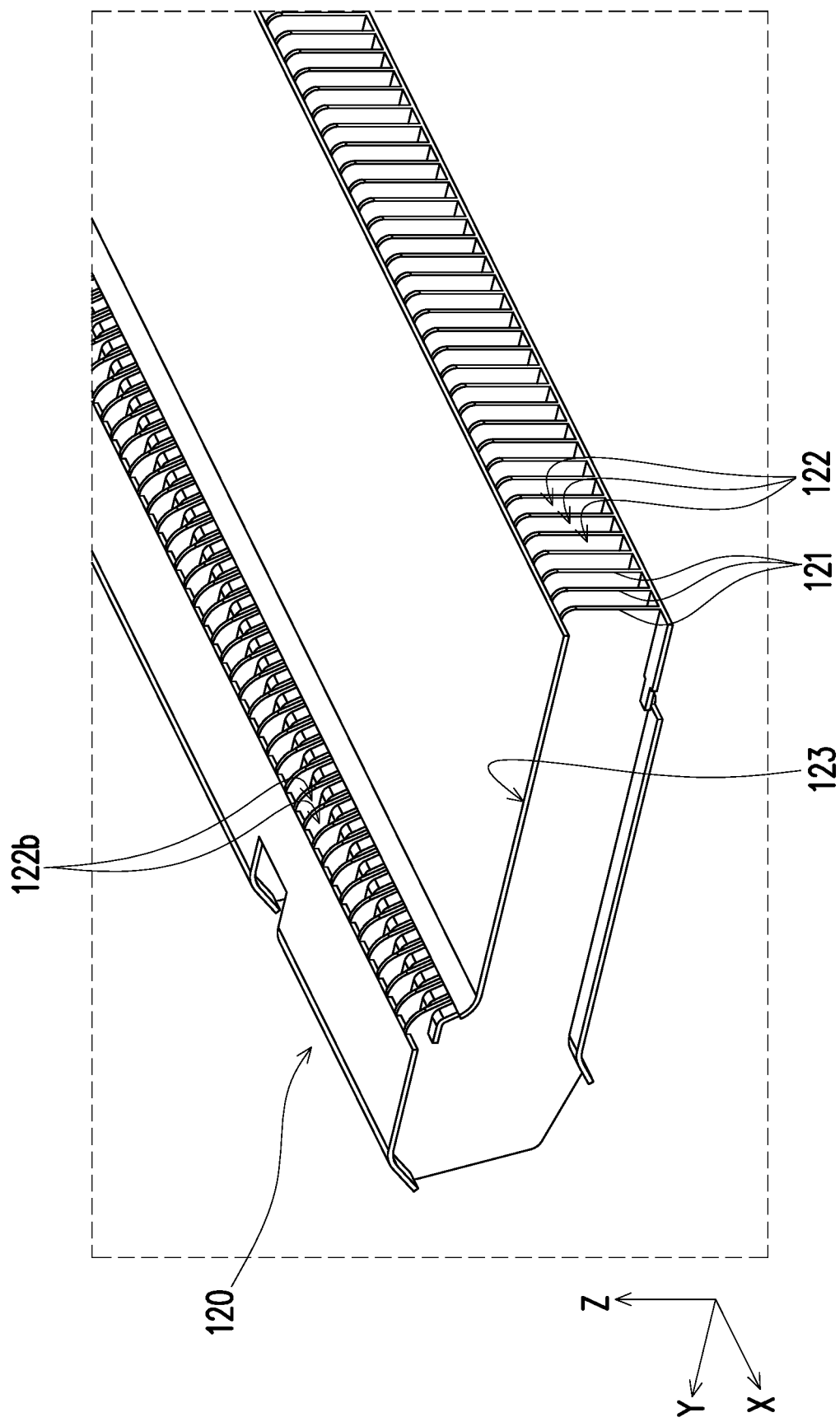
FIG. 3A is a perspective view of a fin assembly of FIG. 1.
Figure 3B:
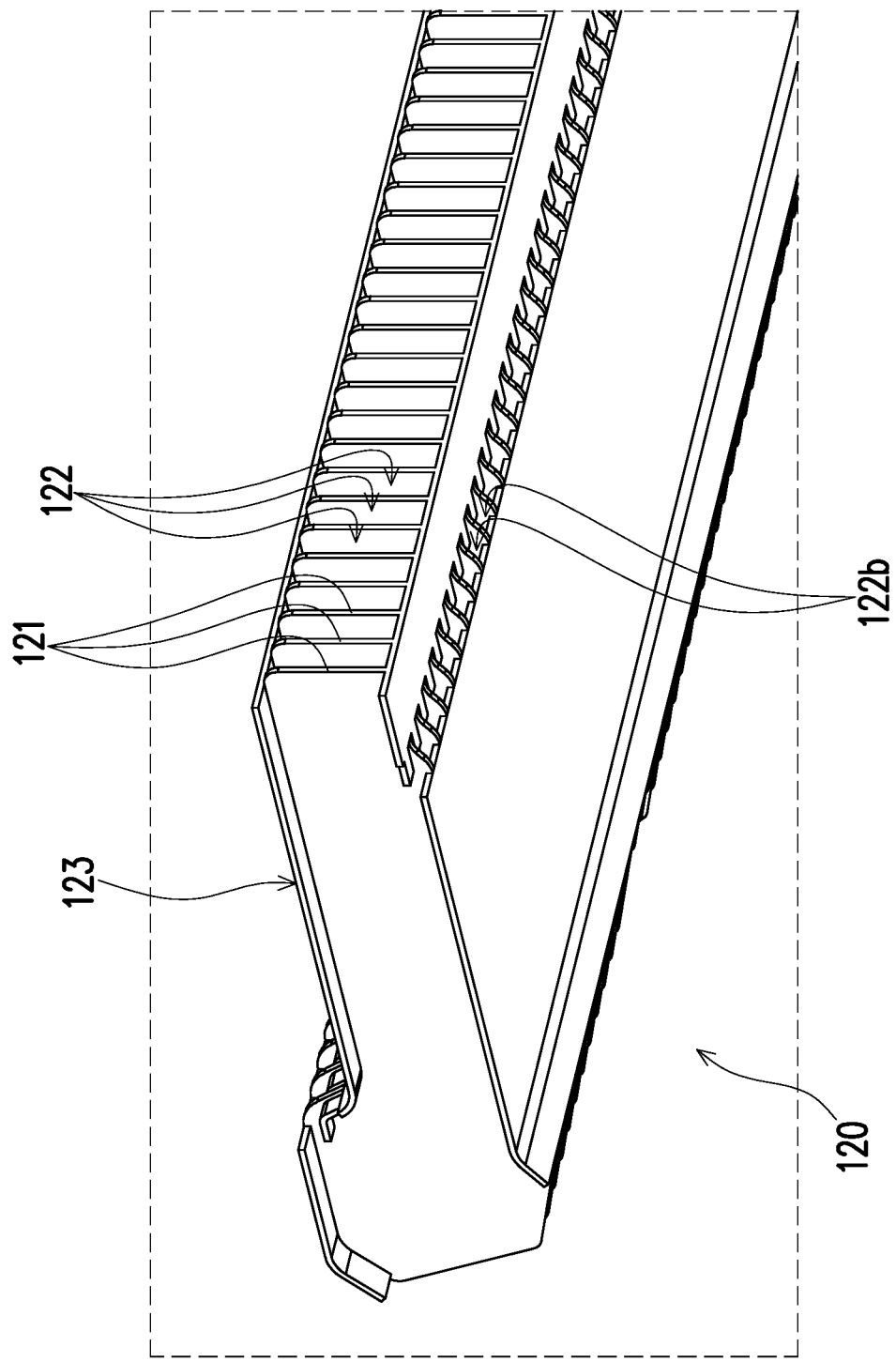
FIG. 3B is a perspective view of FIG. 3A from another angle of view.

FIG. 1 is a perspective view of a thermal module according to an embodiment of the disclosure. FIG. 2 is a partial side view of the thermal module of FIG. 1. FIG. 3A is a perspective view of a fin assembly of FIG. 1. FIG. 3B is a perspective view of FIG. 3A from another angle of view. Here, Cartesian coordinates X, Y, and Z are provided to facilitate subsequent descriptions of the components. Referring to FIG. 1 first, a thermal module 100 in this embodiment is, for example, disposed in a casing (not shown) of a notebook computer, so as to discharge heat generated during the operation of electronic elements (not shown) inside the casing (not shown) to an outside. However, the disclosure is not limited thereto.

Referring to FIGS. 1 to 3B, in this embodiment, the thermal module 100 includes a fan 110 and a fin assembly 120. The fan 110 has an air outlet 111 (FIG. 2), and the fin assembly 120 is disposed to the air outlet 111 of the fan 110. The fin assembly 120 has multiple fins 121 (FIGS. 3A and 3B), and the fins 121 are disposed side by side to form multiple flow channels 122 (FIGS. 3A and 3B).

In detail, referring to FIG. 2, in this embodiment, each of the flow channels 122 has a first inlet 122a, two second inlets 122b, and an outlet 122c, and the two second inlets 122b are located between the first inlet 122a and the outlet 122c (in a direction parallel to the Y axis). Here, it should be noted that in this embodiment, the first inlet 122a corresponds to the air outlet 111 of the fan 110, and the outlet 122c corresponds to a side of a thermal dissipation hole (not shown) of the casing of the notebook computer. However, the disclosure is not limited thereto.

Therefore, in each of the flow channels 122, a gas flow F1 generated by the fan 110 is adapted to flow into the flow channel 122 from the first inlet 122a and flow out of the flow channel 122 from the outlet 122c. At the same time, a gas flow F2 outside the fin assembly 120 is adapted to be drawn by the gas flow F1 in the flow channel 122 to flow into the flow channel 122 from the two second inlets 122b and flow out of the flow channel 122 from the outlet 122c.

It is worth mentioning that in this embodiment, since the gas flow F1 generated by the fan 110 flows into each of the flow channels 122 at a relatively fast flow rate and with a relatively low pressure, the gas flow F2 outside the fin assembly 120 is adapted to be drawn by the gas flow F1 in the flow channel 122 to flow into each of the flow channels 122 from the second inlet 122b, thereby increasing a flow capacity of the gas flow flowing into the fin assembly 120. In addition, the fin assembly 120 of the thermal module 100 in this embodiment may allow the gas flow F2 with a relatively low temperature outside the fin assembly 120 to enter each of the flow channels 122 by a configuration of the second inlet 122b of each of the flow channels 122, so that a proportion of the gas flow F2 with the relatively low temperature flowing through each of the flow channels 122 may be increased. Therefore, the thermal exchange efficiency between the gas flow F1 and the fin assembly 120 is improved, thereby improving the thermal dissipation efficiency of the thermal module 100.

Referring to FIG. 2, in this embodiment, the thermal module 100 further includes a heat pipe 130. The fin assembly 120 has a bearing surface 123, and the heat pipe 130 is adapted to be in contact with the bearing surface 123 of the fin assembly 120. The heat pipe 130 is located between the fan 110 and the outlet 122c of each of the flow channels 122 in the direction parallel to the Y axis, and the bearing surface 123 of the fin assembly 120 is located between the two second inlets 122b of each of the flow channels 122 in a direction parallel to the Z axis.

In detail, in this embodiment, one of the two second inlets 122b of each of the flow channels 122 is close to the fan 110 and located below the bearing surface 123 of the fin assembly 120, and the other of the two second inlets 122b of each of the flow channels 122 is close to the heat pipe 130 and located above the bearing surface 123 of the fin assembly 120. In this way, the gas flow F2 with the relatively low temperature outside the fin assembly 120 may enter each of the flow channels 122 respectively from the two second inlets 122b located above and below the bearing surface 123 of the fin assembly 120. Therefore, the proportion of the gas flow F2 with the relatively low temperature flowing through each of the flow channels 122 is increased, so as to improve the thermal exchange efficiency between the gas flow F1 and the fin assembly 120.

In addition, referring to FIG. 2, in this embodiment, an aperture 122-1 of each of the flow channels 122 gradually expands from the first inlet 122a to the outlet 122c along the direction parallel to the Y axis. The two second inlets 122b of each of the flow channels 122 are respectively located at an incremental position 122-2 of the aperture 122-1 of the flow channel 122. In this way, the gas flow F1 generated by the fan 110 and the gas flow F2 with the relatively low temperature outside the fin assembly 120 may flow into the flow channel 122 respectively from the first inlet 122a and the two second inlets 122b, and smoothly flow out of the flow channel 122 from the outlet 122c.

Hereinafter, the fins 121 of the fin assembly 120 will be further described.

Figure 4:
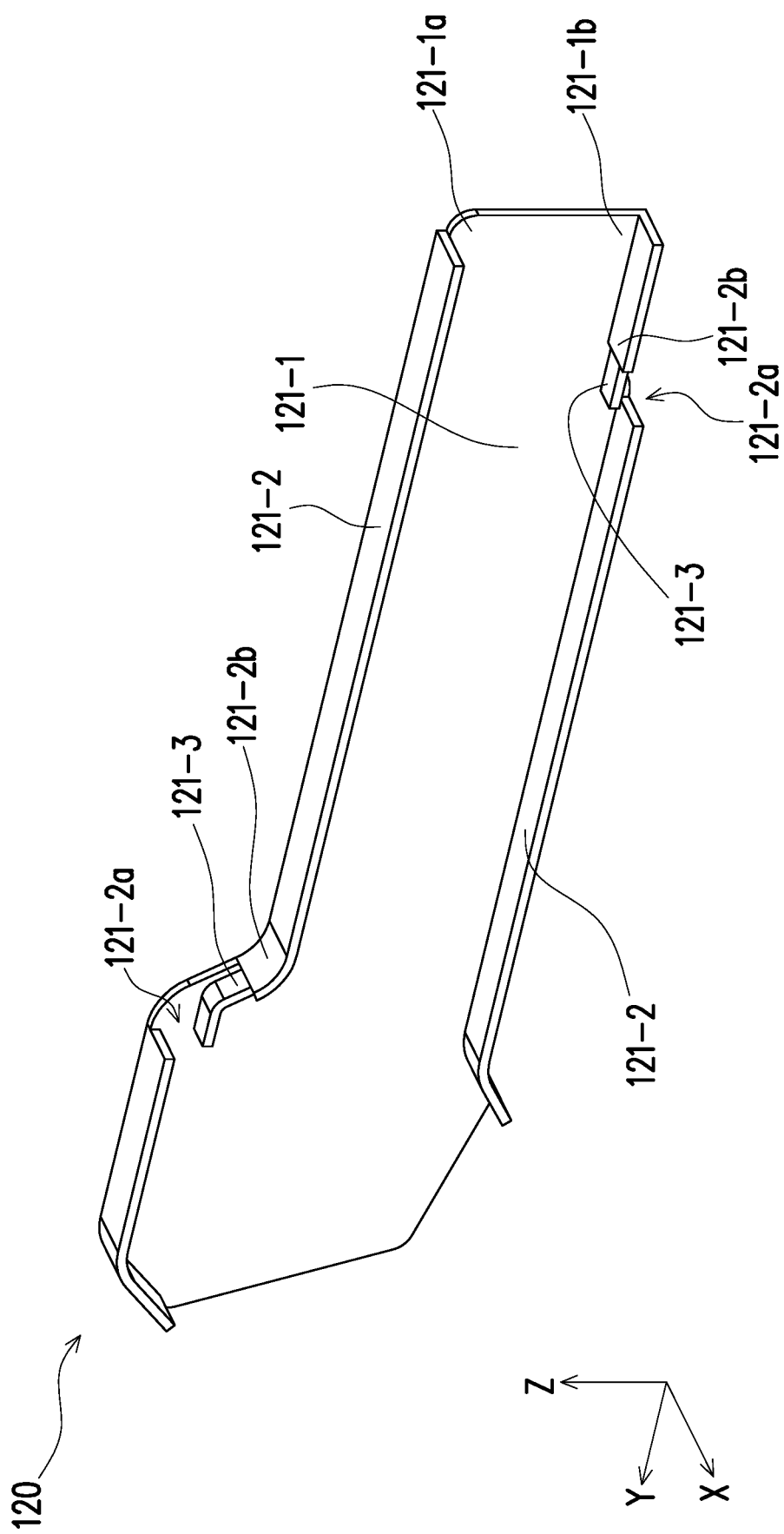
FIG. 4 is a perspective view of a fin of FIG. 3A.

FIG. 4 is a perspective view of a fin of FIG. 3A. Referring to FIG. 4, in this embodiment, each of the fins 121 includes a first side wall 121-1 and two second side walls 121-2. The first side wall 121-1 has two opposite ends 121-1a and 121-1b, and the two second side walls 121-2 are vertically connected to the two ends 121-1a and 121-1b of the first side wall 121-1, respectively. Here, it should be noted that in this embodiment, a structure of each of the fins 121 is, for example, a U-shaped structure formed by folding a sheet metal part, but the disclosure is not limited thereto.

In detail, in this embodiment, each of the fins 121 includes two tongue pieces 121-3. The two second side walls 121-2 respectively have two notches 121-2a, and the two tongue pieces 121-3 respectively protrude from the two notches 121-2a of the two second side walls 121-2 of the fin 121 and are adjacent to an inner edge 121-2b of the two second side walls 121-2 of the fin 121. Each of the second side walls 121-2 forms the second inlet 122b at the notch 121-2a, and the two tongue pieces 121-3 are respectively disposed at the two second inlets 122b (FIG. 2). In other words, in the fin assembly 120 shown in FIG. 1, except for the first one (which is the rightmost fin in the figure), the second side walls 121-2 of the rest of the fins 121 may be connected to another adjacent fin 121 to form the flow channels 122, and the second side wall 121-2 has a continuous structure from the first inlet 122a to the outlet 122c, and is discontinuous only at the second inlet 122b.

In more detail, referring to FIG. 2, in this embodiment, the tongue piece 121-3 disposed at each of the second inlets 122b extend toward the outlet 122c along the direction parallel to the Y axis. An aperture 122b-1 of each of the second inlets 122b may taper (in the Y-axis direction) toward an inside of the flow channel 122 by a configuration of the tongue pieces 121-3 to form a nozzle structure. Here, it should be noted that in this embodiment, each of the tongue pieces 121-3 is, for example, integrally formed with the fin 121, but the disclosure is not limited thereto. In addition, in this embodiment, each of the tongue pieces 121-3 forms the nozzle structure by stamping, for example. However, the disclosure is not limited thereto.

Therefore, in this embodiment, each of the second inlets 122b may guide the gas flow F2 with the relatively low temperature outside the fin assembly 120 into the flow channel 122 by the configuration of the tongue pieces 121-3, and may prevent the gas flow F1 generated by the fan 110 from flowing back at the second inlet 122b and flowing out of the flow channel 122 from the second inlet 122b at the same time. Therefore, it is ensured that the gas flow F2 with the relatively low temperature outside the fin assembly 120 may smoothly enter the flow channel 122, so as to increase the proportion of the gas flow F2 with the relatively low temperature flowing through each of the flow channels 122.

Based on the above, the fin assembly of the thermal module in the disclosure has the fins, and the fins are disposed side by side to form the flow channels. In each of the flow channels, the gas flow generated by the fan is adapted to flow into the flow channel from the first inlet, and the gas flow outside the fin assembly is adapted to be drawn by gas flow in the flow channel to flow into the flow channel from the at least one second inlet. Therefore, in the thermal module in the disclosure, the fin assembly may increase the flow capacity of the gas flow flowing into the fin assembly through the configuration of the at least one second inlet. As a result, the proportion of the gas flow with the relatively low temperature flowing through each of the flow channels is increased, so as to improve the thermal exchange efficiency between the gas flow in each of the flow channels and the fin assembly, so that the thermal module in the disclosure has the good thermal dissipation efficiency.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A thermal module, comprising:
   a fan having an air outlet;
   a heat pipe; and
   a fin assembly having a plurality of fins and disposed to the air outlet of the fan, wherein the fins are disposed side by side to form a plurality of flow channels, and each of the flow channels has a first inlet, at least one second inlet, and an outlet,
   in each of the flow channels, a gas flow generated by the fan flows into the flow channel from the first inlet and flows out of the flow channel from the outlet, and a gas flow outside the fin assembly is drawn by the gas flow in the flow channel to flow into the flow channel form the at least one second inlet,
   wherein the heat pipe is in contact with a bearing surface of the fin assembly, the heat pipe is located between the fan and the outlet of each of the flow channels, a number of the at least one second inlet of each of the flow channels is two, and the bearing surface of the fin assembly is located between the two second inlets of each of the flow channels.

2. The thermal module according to claim 1, wherein an aperture of the at least one second inlet tapers toward an inside of the flow channel to form a nozzle structure.

3. The thermal module according to claim 1, wherein an aperture of each of the flow channels gradually expands from the first inlet to the outlet.

4. The thermal module according to claim 1, wherein an aperture of each of the flow channels increases from the first inlet to the outlet, and the at least one second inlet is located at an incremental position of the aperture of each of the flow channels.

5. The thermal module according to claim 1, further comprising at least one tongue piece disposed at the at least one second inlet of each of the flow channels, and the at least one tongue piece protrudes from each of the fins and is adjacent to an inner edge of each of the fins.

6. The thermal module according to claim 5, wherein the at least one tongue piece is integrally formed with each of the fins.

7. The thermal module according to claim 1, wherein each of the fins comprises a first side wall and two second side walls, the first side wall has two opposite ends, the two second side walls are vertically connected to the two ends of the first side wall, respectively, and the two second side walls have at least one notch.

8. The thermal module according to claim 1, wherein one of the two second inlets of each of the flow channels is close to the fan and located below the bearing surface of the fin assembly, and the other of the two second inlets of each of the flow channels is close to the heat pipe and located above the bearing surface of the fin assembly.

9. The thermal module according to claim 1, wherein the at least one second inlet of each of the flow channels is located between the first inlet and the outlet.

* * * * *